United States Patent
Ke et al.

(10) Patent No.: US 7,633,340 B2
(45) Date of Patent: Dec. 15, 2009

(54) APPARATUS AND METHOD FOR DETERMINING THE VOLTAGE LEVEL OF AN INPUT SIGNAL

(75) Inventors: Chien-Jen Ke, Hsinchu (TW); Chi-Sen Liu, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 486 days.

(21) Appl. No.: 11/685,755

(22) Filed: Mar. 13, 2007

(65) Prior Publication Data

US 2008/0165021 A1    Jul. 10, 2008

(30) Foreign Application Priority Data

Jan. 4, 2007    (TW) .............................. 96100374 A

(51) Int. Cl.
*H03F 3/04*    (2006.01)

(52) U.S. Cl. ...................................... 330/250; 330/295

(58) Field of Classification Search ................ 330/250, 330/295, 124 R, 84, 126
See application file for complete search history.

(56) References Cited

U.S. PATENT DOCUMENTS

| | | | | |
|---|---|---|---|---|
| 3,673,507 | A | * | 6/1972 | Prescott ...................... 330/295 |
| 4,184,125 | A | * | 1/1980 | Mullally ...................... 330/282 |
| 4,590,437 | A | * | 5/1986 | Butler et al. ................ 330/277 |
| 7,276,968 | B2 | * | 10/2007 | Ozawa et al. ............... 330/251 |

* cited by examiner

*Primary Examiner*—Henry K Choe
(74) *Attorney, Agent, or Firm*—WPAT., P.C.; Justin King

(57) ABSTRACT

The present invention discloses an apparatus and a method for determining the voltage level of a first signal from a playback device having an interface in compliance with an industrial standard. According to the method, first receive the first signal by a signal receiving pin electrically coupled to a signal transmitting pin of the interface. Then output a first output voltage by processing the first signal by the combination of a first zener diode and a first transistor and a second output voltage by processing the first signal by the combination of a second zener diode and a second transistor. Thus the voltage level of the first signal can be determined according to the first output voltage and the second output voltage.

19 Claims, 6 Drawing Sheets

| Voltage level | Aspect ratio |
|---|---|
| 9.5V~12V | 4:3 |
| 4.5V~7V | 16:9 |
| 0V~2V | Inactive |

| Output voltage \ Voltage level (aspect ratio) | 9.5V~12V (4:3) | 4.5V~7V (16:9) | 0V~2V (Inactive) |
|---|---|---|---|
| First output voltage V1 | 0V (logic '0') | 0V (logic '0') | 3.3V (logic '1') |
| Second output voltage V2 | 0V (logic '0') | 3.3V (logic '1') | 3.3V (logic '1') |

FIG.3C

APPARATUS AND METHOD FOR DETERMINING THE VOLTAGE LEVEL OF AN INPUT SIGNAL

FIELD OF THE INVENTION

The present invention relates to an apparatus and method for determining the voltage level of an input signal, and more particularly to the apparatus and method that is used in a player with a SCART interface by using zener diodes and transistors.

BACKGROUND OF THE INVENTION

The SCART interface has been widely utilized for the video/audio signal transmission in TV sets or players. For example, the SCART interface is a standardized interface that must be implemented in the TV sets and VCR players for sale in European marketplace. FIG. 1A and FIG. 1B are diagrams illustrating the SCART interface and its connectors. FIG. 1A demonstrates a SCART connector 10 that has 21 connecting pins that includes pins for audio/video signals and pins designated for conveying information that controls the transmission of audio/video signals. FIG. 1B demonstrates a SCART socket 11 that has connecting holes for adapting the corresponding connecting pins on the SCART connector 10.

Other than TV sets and players, the SCART interface has been also pervasively equipped in audio/video playback devices or signal conversion devices such as video game consoles, disc players, set-top boxes, or video signal converters. As shown in FIG. 1C, for example, a set-top box 12 can be used to integrate audio/video signals from various sources for the displaying on a TV set through a plurality of SCART sockets 121 and 122. Users can allow the audio/video signal transmission among SCART sockets by connecting them by a SCART cable. For example, as shown in FIG. 1D, a SCART-to-SCART connection can be made by connecting connectors 101 and 102 disposed at two ends of a SCART cable 100 to a SCART socket 141 of a TV set 14 and a SCART socket 161 of a VCR player 16 (or a audio/video playback device such as a disc player, video game console, or set-top boxes), respectively.

Among the 21 connecting pins of a SCART connector, one of the pins, the Pin 8, has been assigned to convey the information to control the aspect ratio of the displayed image. It allows a TV set to determine the proper aspect ration between different aspect rations including the traditional 4:3 screen and 16:9 widescreen. The TV set that connected with a player via SCART interface receives the controlling signal from the player and determines the aspect ratio the player is using according to EN50049-1 and IEC 60933 industry standards. These standards defined the relationship between the voltage level of the controlling signal on the pin 8 and the aspect ratio that is currently assigned such that the TV set can display the image with properly settings. The detailed definition of the signal on the pin 8, as shown in FIG. 2A, is: if the voltage level is between 9.5V and 12V, the assigned aspect ration is 4:3; if the voltage level is between 4.5V and 7V, the assigned aspect ration is 16:9; and if the voltage level is between 0V and 2V, there is no image signal (inactive source) or no specific aspect ration assigned.

To determining the voltage level of the input controlling signal and the aspect ratio it represents, the simplest and most feasible way is to compare the input controlling signal by multiple comparators and translate the comparing results into digital output that can be further processed by logic circuits. Conventionally, in a SCART interface there were two comparators connected to a SCART socket, and the following logic circuit can determine the voltage level of the input controlling signal according to the combination of the two logic output of the comparators.

FIG. 2B is a circuit diagram of the implementation of the comparators 21 and 22 in the SCART interface 20. The negative input of each comparator 21 and 22 is connected to a reference voltage, while the positive input is connected to the input signal. According to the definition illustrated in FIG. 2A, the reference voltages can be set as 8.9V and 4V for comparators 21 and 22, respectively. When the input signal is with voltage level between 9.5V to 12V, both comparators output logical "1." Similarly, if the input signal is with voltage level between 4.5V to 7V, the comparators 21 and 22 will output logical "0" and "1," respectively. And two logical "0s" will be output if the input signal is with voltage level between 0V to 2V. Therefore, the following logic circuit can learn the assigned aspect ration according these logic outputs. For example, when the output is "11," it means the 4:3 screen; when the output is "01," it means the 16:9 screen; and when the output is "00," it means the "inactive" setting.

However, the conventional implementation by using two comparators usually accompanies with higher manufacturing costs. And a low-cost solution with a high precision for detecting the voltage level of the input signal becomes an important issue to be resolved.

SUMMARY OF THE INVENTION

One of the objects of the present invention is to provide an apparatus and method for determining the voltage level of an input signal with low-cost and high precision by using zener diodes and transistors.

The present invention provides an apparatus for determining the voltage level of a first signal from a playback device having an interface in compliance with an industrial standard. the apparatus includes a signal receiving pin electrically coupled to a signal transmitting pin of the interface to receive the first signal, a first zener diode having a first breakdown voltage, where the cathode of the first zener diode is connected to the signal receiving pin, a first transistor having a first forward biased voltage, where the anode of the first zener diode is connected to the base of the first transistor and provide a first output voltage, a second zener diode having a second breakdown voltage, where the cathode of the second zener diode is connected to the signal receiving pin, a second transistor having a second forward biased voltage, where the anode of the second zener diode is connected to the base of the second transistor and provide a second output voltage, and a processor electrically coupled to the first transistor and the second transistor, where the processor can determine the voltage level of the first signal according to first output voltage and the second output voltage.

The present invention further provides a method for determining the voltage level of a first signal from a playback device having an interface in compliance with an industrial standard. According to the method, first receive the first signal by a signal receiving pin electrically coupled to a signal transmitting pin of the interface. Then output a first output voltage by processing the first signal by the combination of a first zener diode and a first transistor and a second output voltage by processing the first signal by the combination of a second zener diode and a second transistor. Thus the voltage level of the first signal can be determined according to the first output voltage and the second output voltage.

BRIEF DESCRIPTION OF THE DRAWINGS

The above contents of the present invention will become more readily apparent to those ordinarily skilled in the art after reviewing the following detailed description and accompanying drawings, in which:

FIG. 3C is a table illustrating the relationship between the voltage level of an input signal and the output logic values according to an embodiment of the present invention.

DETAILED DESCRIPTION OF THE PREFERRED EMBODIMENT

Figure 1A:
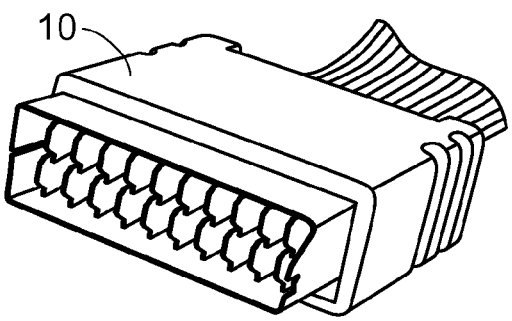
FIG. 1A is a diagram of a SCART connector.
Figure 1B:
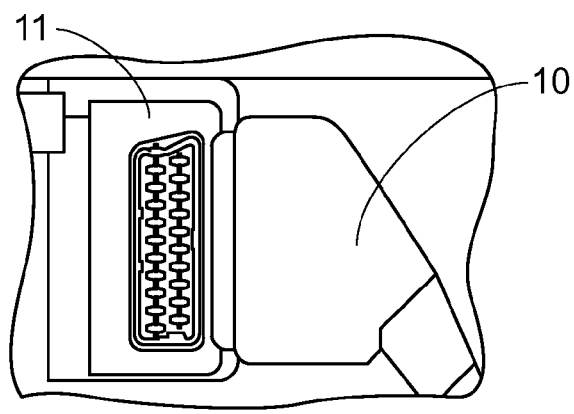
FIG. 1B is a diagram of a SCART socket.
Figure 1C:
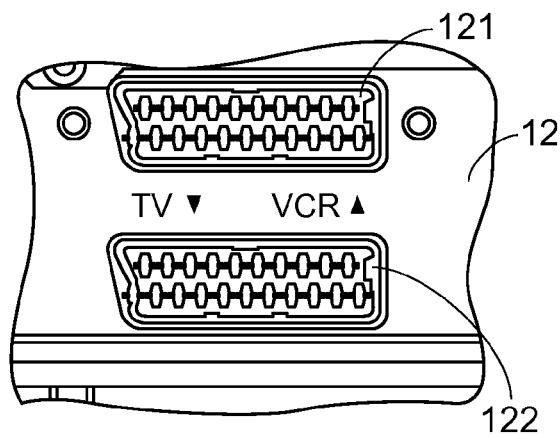
FIG. 1C is a diagram of a set-top box with two SCART sockets.
Figure 1D:
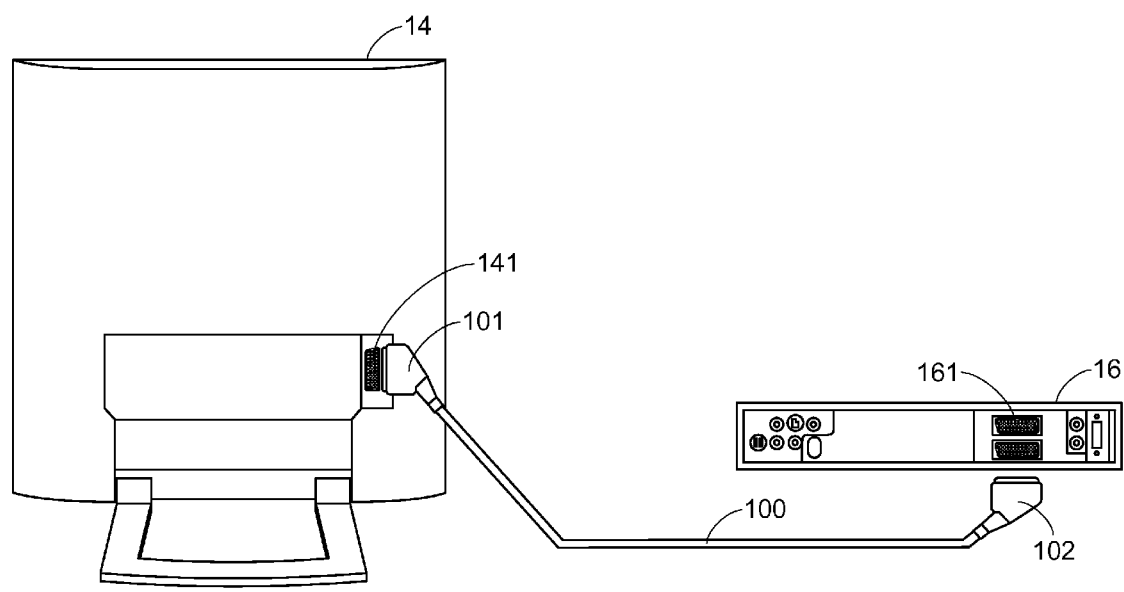
FIG. 1D is a diagram illustrating a SCART-to-SCART connection between a TV set and a VCR player.
Figures 2A, 2B:
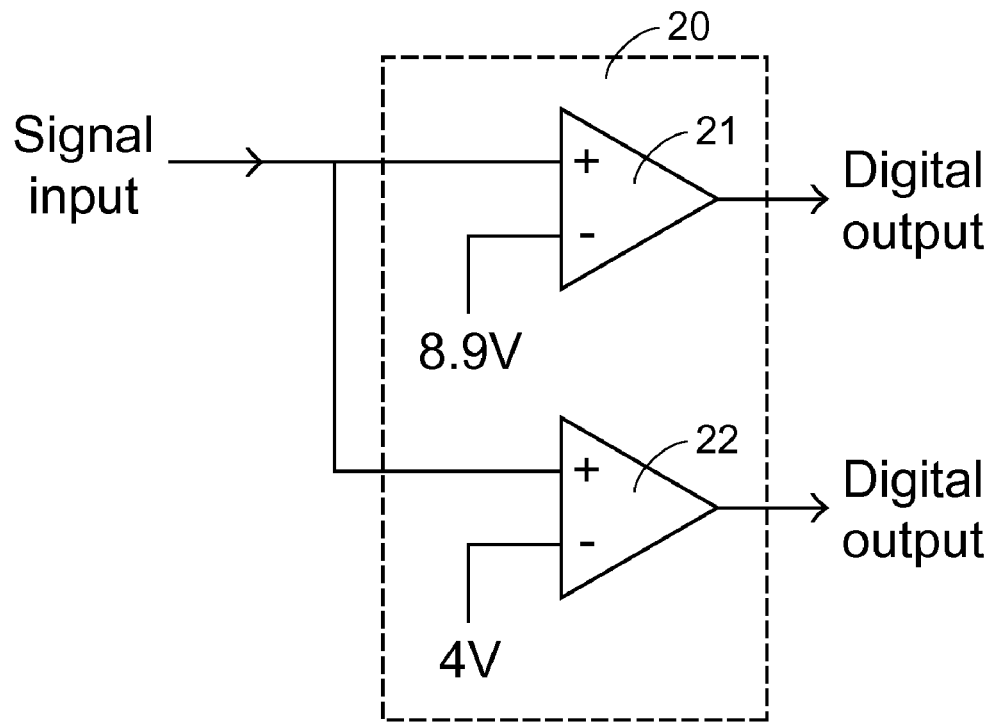
FIG. 2A is a table illustrating the detailed definition of the input voltage level according to industrial standards.
FIG. 2B is a circuit diagram illustrating the implementation of two comparators in a SCART interface.
Figure 3A:
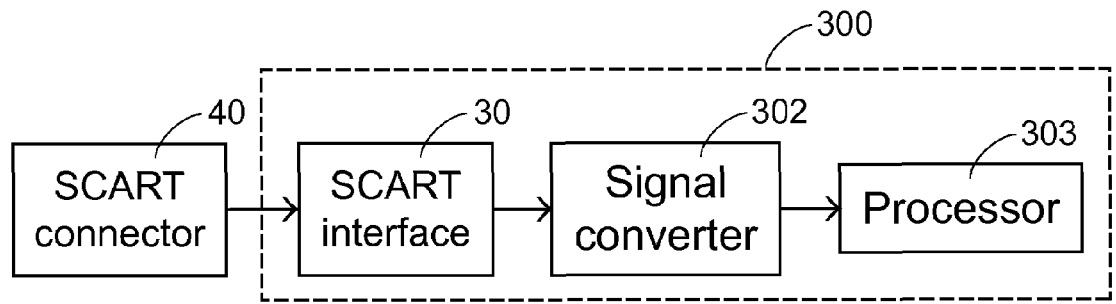
FIG. 3A is a block diagram illustrating an apparatus for determining the voltage level according to an embodiment of the present invention.

Refer to FIG. 3A, which is a block diagram illustrating an apparatus for determining the voltage level according to an embodiment of the present invention. A player 300 includes a SCART interface 30 allowing the signal transmission among other playback devices in compliance with SCART interface standard. A SCART connector 40 is connected to a corresponding SCART socket (not shown in the diagram) disposed on the SCART interface 30. The SCART interface 30 is used to receive an input signal and transfer the input signal. The player 300 further includes a signal converter 302 electrically coupled to the SCART interface 30 to receive the input signal and converts the input signal into logic signals that can be processed by the following logic circuits, such as a processor 303 that can determine the voltage level of the input signal according to the logic value it received from the converter 302. According to the present invention, the input signal is the signal on the Pin 8 of the SCART connector.

Figure 3B:
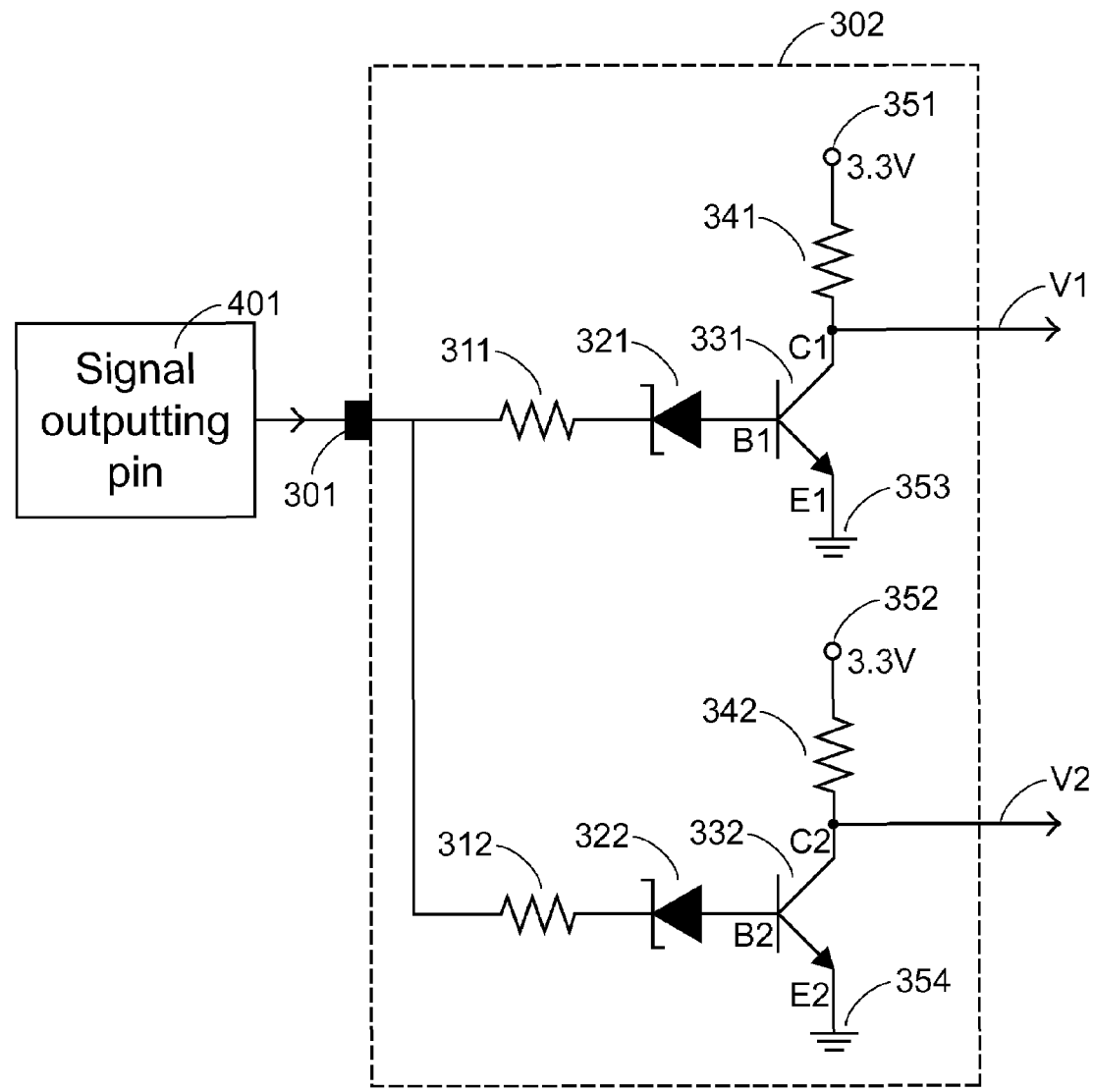
FIG. 3B is a circuit diagram illustrating the signal converter for determining the voltage level according to an embodiment of the present invention.

FIG. 3B is a circuit diagram illustrating the signal converter 302 for determining the voltage level according to an embodiment of the present invention. The signal converter 302 includes a signal receiving pin 301 electrically couples to a signal outputting pin 401 of the SCART interface 30 to receive the input signal. For example, the pin 401 is connected to the Pin 8 of conventional SCART connector that indicating signal relates to the widescreen function switching or the aspect ration of the displayed image. Thus the player 300 can determine the assigned aspect ration according to the voltage level of the input signal.

Instead of the comparators used in the conventional method, the signal converter 302 according to the present invention includes components utilized the combination of a zener diode and a transistor to replace a relatively expensive comparator and its reference voltage. Zener diodes can works properly with limited current at its breakdown region when reversed biased and can provide a stable voltage drop across the component, which is known as its breakdown voltage.

As shown in FIG. 3B, the cathode of a first zener diode 321 is connected to the signal receiving pin 301 via a resistor 311. The Anode of the first zener diode 321 is connected to the base B1 of a transistor 331. The emitter E1 is connected to the first ground 353, and the collector C1 is connected to the first power source 351 via a resistor 341. Similarly, a second zener diode 322 is connected to the signal receiving pin 301 via a resistor 312. The Anode of the second zener diode 322 is connected to the base B2 of a transistor 332. The emitter E2 is connected to the second ground 354, and the collector C2 is connected to the second power source 352 via a resistor 342. The resistors 311 and 312 can be 10 k Ohm resistors in current embodiment because the industrial standards such as EN50049-1 and IEC60933 explicitly require the input impedance to be at least 10 k Ohm. In the current embodiment, the resistors 341 and 342 can also be 10 k Ohm resistors.

Moreover, in the current embodiment, the first zener diode 321 and the second diode 322 are designed to have breakdown voltage at 3.3V and 8.2V, respectively. The two power sources 351 and 352 are set at 3.3V, and the forward biased voltage of transistors 331 and the 332 is about 0.7V. Generally, a transistor can be turned on when the base voltage is greater than the emitter voltage by more than the forward biased voltage; otherwise the transistor is turned off. For example, when the transistor 331 is turned on, the voltage at the collector C1 will be pulled close to the voltage at the emitter E1, thus the output voltage V1 will be close to 0V. On the contrary, if the transistor 331 is turned off, the voltage at the collector C1 will be pulled up to the power source 351, and the output voltage V1 will be close to 3.3V. Similarly, the second transistor 332 can perform substantially the same function as the first transistor 331 and output a second output voltage V2. Therefore the transistors 331 and 332 can convert the input signal into digital form having the logical "1" at 3.3V and logical "0" at 0V for the following logic circuit, such as a processor 303, to process. Of course, if it is necessary, the power sources can be designed to have different voltage levels to support different voltage requirement of logical "1" of the following logic circuits. For example, if the following logic system requires logical "1" at 5V, the power sources 351 and 352 can also be 5V accordingly.

Then the voltage level of the input controlling signal from the signal outputting pin 401 can be determined according the combination of the first output voltage V1 and the second output voltage V2, and the assigned aspect ration can also be confirmed. The output voltage V1 and V2 can be seen as logic signals that can be easily processed by the following logic circuits.

As the definition according to the industrial standards, when the input signal is with voltage level between 9.5V to 12V, the assigned aspect ratio is 4:3; when the input signal is with voltage level between 4.5V to 7V, assigned aspect ratio is 16:9; and the input signal is with voltage level between 0V to 2V, it means the "inactive" setting. Now the following logic circuit or processor can learn the assigned aspect ration according to the logic combinations similar to what have been used in the convention arts.

In the current embodiment, two predetermined threshold voltages are designed to be 8.9V and 4V to allow some toleration in signal qualities. When the input controlling signal is between 9.5V to 12V as defined in the industrial standards or any level above 8.9V, the second zener diode 322 will be negative biased in breakdown region and have an 8.2V voltage difference. The second transistor 332 will be turned on because there is a 0.7V difference allowed between the base B2 and the emitter E2. Thus the second output voltage V2 will be about 0V. Similarly, the voltage drop of the first zener diode 321 allows the first transistor to be turned on and further output a first output voltage V1 at about 0V. Then the following logic circuit or the processor 303 can find the assigned ratio is 4:3 if both output voltages are 0V or the corresponding logic value is "00."

Similarly, when the input controlling signal is between 4.5V to 7V as defined in the industrial standards or any level above 4V but below 8.9V, the first zener diode 321 will be negative biased in breakdown region and have a 3.3V voltage difference. The first transistor 331 will be turned on because there is a 0.7V difference allowed between the base B1 and the emitter E1. Thus the first output voltage V1 will be about 0V. On the contrary, the second zener diode 322 is still off and the second transistor 332 is turned off, either. The collector C2 will be pulled high and have a second voltage output V2 at about 3.3V. Then the following logic circuit or the processor 303 can find the assigned ratio is 16:9 if the output voltages V1 and V2 are 0V and 3.3V, respectively, or the corresponding logic value is "01."

Moreover, if the input controlling signal is between 0V to 2V as defined in the industrial standards or any level below 4V, both transistors will be turned off and both voltage outputs V1 and V2 will be at 3.3V. Then the following logic circuit or the processor 303 can find the assigned ratio is "inactive" setting if both output voltages V1 and V2 are 3.3V or the corresponding logic value is "11."

Refers to FIG. 3C, which is a table illustrating the relationship between the voltage level of an input signal and the output logic values according to an embodiment of the present invention. The relationship between the voltage level of the input controlling signal, the output logic values, and the assigned aspect ratio as abovementioned can be further summarized into a table as shown in FIG. 3C. The table cab be further stored in the processor 303 to allow the processor to determine the assigned aspect ratio appropriately based on the output voltages V1 and V2.

Figure 4:
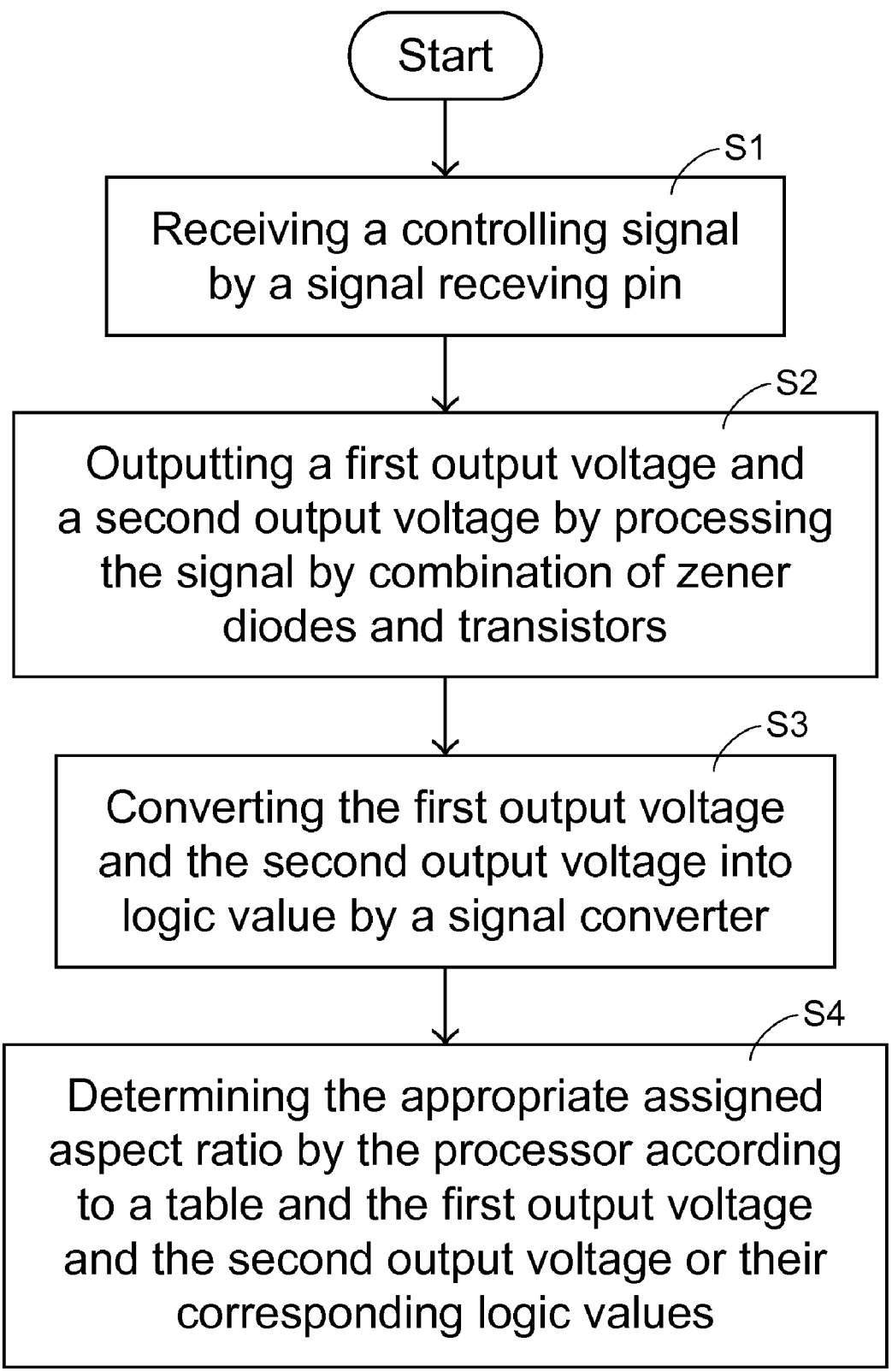
FIG. 4 is a flowchart illustrating a method for determining the voltage level according to an embodiment of the present invention.

FIG. 4 is a flowchart further illustrating a method for determining the voltage level according to an embodiment of the present invention. First a signal receiving pin 301 receives a controlling signal from a signal outputting pin 401 (Step S1). Then output a first output voltage V1 and a second output voltage V2 by processing the controlling signal by the combination of a first zener diode 321 and a first transistor 331 and the combination of a second zener diode 322 and a second transistor 332, respectively (Step S2). Then convert the first output voltage V1 and the second output voltage V2 into logic value by a signal converter 302 (Step S3). Finally, determine the appropriate assigned aspect ratio by the processor 302 according to a table and the first output voltage V1 and the second output voltage V2, or their corresponding logic values (Step S4).

Thus, the present invention can not only determine the voltage level of an input signal with a high precision, but also replace the conventional comparators with relatively cost-saving zener diodes and transistors.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An apparatus for determining the voltage level of a first signal from a playback device having an interface in compliance with an industrial standard, and the apparatus comprises:
   a signal receiving pin electrically coupled to a signal transmitting pin of the interface to receive the first signal;
   a first zener diode having a first breakdown voltage, where the cathode of the first zener diode is connected to the signal receiving pin;
   a first transistor having a first forward biased voltage, where the anode of the first zener diode is connected to the base of the first transistor and provide a first output voltage;
   a second zener diode having a second breakdown voltage, where the cathode of the second zener diode is connected to the signal receiving pin;
   a second transistor having a second forward biased voltage, where the anode of the second zener diode is connected to the base of the second transistor and provide a second output voltage; and
   a processor electrically coupled to the first transistor and the second transistor, where the processor can determine the voltage level of the first signal according to first output voltage and the second output voltage.

2. The apparatus according to claim 1 wherein the first breakdown voltage of the first zener diode is 3.3V.

3. The apparatus according to claim 1 wherein the second breakdown voltage of the first second diode is 8.2V.

4. The apparatus according to claim 1 wherein the collector of the first transistor is connected to a first power source via a first resistor, the emitter of the first transistor is connected to a first ground, the collector of the second transistor is connected to a second power source via a second resistor, and the emitter of the second transistor is connected to a second ground.

5. The apparatus according to claim 4 wherein the first power source and the second power source are 3.3V voltage sources.

6. The apparatus according to claim 1 wherein the first transistor provides the first output voltage at the collector of the first transistor, and the second transistor provides the second output voltage at the collector of the first transistor.

7. The apparatus according to claim 1 wherein the interface in compliance with the industrial standard is an interface in compliance with SCART standard.

8. The apparatus according to claim 7 wherein the signal transmitting pin of the interface is the "Pin 8" of the interface in compliance with SCART standard.

9. The apparatus according to claim 1 wherein apparatus further comprises a signal converter to convert the first voltage output and the second voltage output into logic values.

10. The apparatus according to claim 9 wherein the first voltage output and the second voltage can be represented by the combination of a first logic value and a second logic value.

11. The apparatus according to claim 9 wherein the processor keeps a table summarizing the relationship between the voltage level of the first signal and the logic values converted from the first voltage output and the second voltage output, thereby the processor can determine the voltage level of the first signal based on the first output voltages and the second output voltage.

12. A method for determining the voltage level of a first signal from a playback device having an interface in compliance with an industrial standard, the method comprises steps of:
   receiving the first signal by a signal receiving pin electrically coupled to a signal transmitting pin of the interface;

outputting a first output voltage by processing the first signal by the combination of a first zener diode and a first transistor;

outputting a second output voltage by processing the first signal by the combination of a second zener diode and a second transistor; and determining the voltage level of the first signal according to the first output voltage and the second output voltage.

13. The method according to claim 12 wherein the collector of the first transistor is connected to a first power source via a first resistor, the emitter of the first transistor is connected to a first ground, the collector of the second transistor is connected to a second power source via a second resistor, and the emitter of the second transistor is connected to a second ground.

14. The method according to claim 13 wherein the first zener diode has a first breakdown voltage and the first transistor has a first forward biased voltage.

15. The method according to claim 14 wherein the first breakdown voltage is 3.3V and the first forward biased voltage is 0.7V.

16. The method according to claim 13 wherein the second zener diode has a second breakdown voltage and the second transistor has a second forward biased voltage.

17. The method according to claim 16 wherein the second breakdown voltage is 8.2V and the second forward biased voltage is 0.7V.

18. The method according to claim 13 wherein the first power source and the second power source are 3.3V voltage sources.

19. The method according to claim 12 wherein the method further comprises steps of:

converting the first output voltage and the second output voltage into logic values by a signal converter; and determining the voltage level of the first signal by a processor according a table summarizing the relationship between the voltage level of the first signal and the logic values converted from the first voltage output and the second voltage output.

* * * * *